(12) United States Patent
Dupuis et al.

(10) Patent No.: US 7,413,967 B2
(45) Date of Patent: Aug. 19, 2008

(54) YIELD IMPROVEMENT IN SILICON-GERMANIUM EPITAXIAL GROWTH

(75) Inventors: Mark D. Dupuis, South Burlington, VT (US); Wade J. Hodge, Georgia, VT (US); Daniel T. Kelly, Georgia, VT (US); Ryan W. Wuthrich, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 11/468,030

(22) Filed: Aug. 29, 2006

(65) Prior Publication Data

US 2006/0289959 A1   Dec. 28, 2006

Related U.S. Application Data

(62) Division of application No. 10/709,644, filed on May 19, 2004, now Pat. No. 7,118,995.

(51) Int. Cl.
*H01L 21/20* (2006.01)
(52) U.S. Cl. .................. 438/488; 438/489; 438/507
(58) Field of Classification Search ............... None
See application file for complete search history.

(56) References Cited

U.S. PATENT DOCUMENTS 5,358,895 A   10/1994   Steele et al.
6,100,152 A *  8/2000   Emons et al. ............... 438/350
6,365,479 B1*  4/2002   U'Ren ......................... 438/320
2002/0115228 A1*  8/2002   Kiyota ............................ 438/7
2003/0139000 A1   7/2003   Bedell et al.

FOREIGN PATENT DOCUMENTS

JP          5315269 A       11/1993
JP        2003158075 A       5/2003
WO       WO03103031 A2     12/2003

OTHER PUBLICATIONS

J. H. Comfort et al.; Complementary SiGe Heterojunction Bipolar Transistor Process With Common SiGe Epilayer; vol. 35, No. 5; Oct. 1992; pp. 288-290.

* cited by examiner

*Primary Examiner*—Trung Dang
(74) *Attorney, Agent, or Firm*—Schmeiser, Olsen & Watts; William D. Sabo

(57) ABSTRACT

A method for determining a SiGe deposition condition so as to improve yield of a semiconductor structure. Fabrication of the semiconductor structure starts with a single-crystal silicon (Si) layer. Then, first and second shallow trench isolation (STI) regions are formed in the single-crystal Si layer. The STI regions sandwich and define a first single-crystal Si region. Next, silicon-germanium (SiGe) mixture is deposited on top of the structure in a SiGe deposition condition so as to grow (i) a second single-crystal silicon region grows up from the top surface of the first single-crystal silicon region and (ii) first and second polysilicon regions from the top surfaces of the first and second STI regions, respectively. By increasing SiGe deposition temperature and/or lowering precursor flow rate until the resulting yield is within a pre-specified range, a satisfactory SiGe deposition condition can be determined for mass production of the structure.

27 Claims, 2 Drawing Sheets

US 7,413,967 B2

YIELD IMPROVEMENT IN SILICON-GERMANIUM EPITAXIAL GROWTH

This application is a Divisional of Ser. No. 10/709,644, filed May 19, 2004, now U.S. Pat. No. 7,118,995.

BACKGROUND OF THE INVENTION

1. Technical Field

The present invention relates to silicon-germanium (SiGe) epitaxial (EPI) growth, and more particularly, to yield improvement in silicon-germanium epitaxial growth.

2. Related Art

A typical fabrication process to form an NPN device starts out with a single-crystal silicon layer on a wafer. Then, first and second shallow trench isolation (STI) regions are formed in the single-crystal silicon layer. The collector of the NPN device is to reside in a first single-crystal silicon region sandwiched between the first and second STI regions. Next, silicon (Si) and germanium (Ge) are deposited on top surfaces of the single-crystal silicon region and the first and second STI regions. As a result of the SiGe deposition, a second single-crystal silicon region grows up from the top surface of the first single-crystal silicon region. Also as a result of the SiGe deposition, first and second polysilicon regions grow up from the top surfaces of the first and second STI regions, respectively. The emitter and base of the NPN device are to reside in the second single-crystal silicon region.

The first single-crystal silicon region and the first STI region have a first common interface surface. The first single-crystal silicon region and the second STI region have a second common interface surface. The top edges of the first and second common interface surfaces are where high material stress is present. This high material stress may result in cracks that propagate into the first and second single-crystal silicon regions causing electrical shorts between the collector and the emitter of the NPN device. This in turn decreases the yield for the NPN device.

Therefore, there is a need for a method for fabricating NPN devices having a relatively higher yield than is disclosed in the prior art.

SUMMARY OF THE INVENTION

The present invention provides a method for method for forming semiconductor structures, the method comprising the steps of (a) forming a first plurality of identical semiconductor structures, wherein each of the first plurality of identical semiconductor structures is formed by (i) forming a first region and a second region, wherein the first region and the second region are in direct physical contact with each other via a first common interface surface, and (ii) depositing a growth material simultaneously on top of the first and second regions so as to grow third and fourth regions from the first and second regions, respectively, such that a second common interface surface between the third and fourth region grows from the first common interface surface, wherein the first and third regions comprise a same material and have single-crystal atoms arrangement, wherein the first region has a different atoms arrangement than the fourth region, and wherein the step of depositing the growth material is performed under a first deposition condition; and (b) if a first yield of the first plurality of identical semiconductor structures is not within a pre-specified range of a target yield, forming a second plurality of identical semiconductor structures, wherein each of the second plurality of identical semiconductor structures is formed by using steps similar to steps (a)(i) and (a)(ii), except that the step of depositing the growth material is performed under a second deposition condition.

The present invention also provides a method for forming semiconductor structures, the method comprising the steps of (a) forming a first plurality of identical semiconductor structures, wherein each of the first plurality of identical semiconductor structures is formed by (i) forming a first single-crystal semiconductor region and first and second shallow trench isolation regions on a semiconductor substrate, wherein the first single-crystal semiconductor region is sandwiched between the first and second shallow trench isolation regions, and (ii) depositing a growth material simultaneously (A) on top of the first single-crystal semiconductor region to grow a second single-crystal semiconductor region from the first single-crystal semiconductor region and (B) on top of the first and second shallow trench isolation regions to grow first and second polysilicon regions from the first and second shallow trench isolation regions, respectively, wherein the second single-crystal semiconductor region and the first polysilicon region are in direct physical contact with each other, wherein the second single-crystal semiconductor region and the second polysilicon region are in direct physical contact with each other, and wherein the step of depositing the growth material is performed under a first deposition condition; and (b) if a first yield of the first plurality of identical semiconductor structures is not within a pre-specified range of a target yield, forming a second plurality of identical semiconductor structures, wherein each of the second plurality of identical semiconductor structures is formed by using steps similar to steps (a)(i) and (a)(ii), except that the step of depositing the growth material is performed under a second deposition condition.

The present invention also provides a method for forming semiconductor structures, the method comprising the steps of (a) forming a first plurality of identical semiconductor structures, wherein each of the first plurality of identical semiconductor structures is formed by (i) providing a silicon substrate, (ii) forming a single-crystal silicon layer on the substrate, (iii) forming first and second shallow trench isolation regions in the single-crystal silicon region, the first and second shallow trench isolation regions defining a first single-crystal silicon region sandwiched between the first and second shallow trench isolation regions, (iv) growing a seed layer of polysilicon on top of the first and second shallow trench isolation regions, and (v) depositing silicon and germanium simultaneously (A) on top of the first single-crystal silicon region so as to grow a second single-crystal silicon region and (B) on top of the first and second shallow trench isolation regions so as to grow first and second polysilicon regions, respectively, wherein the second single-crystal silicon region and the first polysilicon region are in direct physical contact with each other, wherein the second single-crystal silicon region and the second ploy-silicon region are in direct physical contact with each other, and wherein the step of depositing silicon and germanium is performed under a first deposition condition; and (b) if a first yield of the first plurality of identical semiconductor structures is not within a pre-specified range of a target yield, forming a second plurality of identical semiconductor structures, wherein each of the second plurality of identical semiconductor structures is formed by using steps similar to steps (a)(i) and (a)(ii), except that the step of depositing the growth material is performed under a second deposition condition.

The present invention also provides a method for determining a fabrication condition for a semiconductor structure design, the method comprising the steps of (a) providing a relationship between a yield of the semiconductor structure design, a deposition temperature, and a precursor flow rate, wherein the semiconductor structure design comprises (i) a first region and a second region, wherein the first region and the second region are in direct physical contact with each other via a first common interface surface, and (ii) a third region and a fourth region being on top of the first and second regions, respectively, wherein the third and fourth regions are grown by a step of depositing a growth material simultaneously on top of the first and second regions such that a second common interface surface between the third and fourth region grows from the first common interface surface, wherein the first and third regions comprise a same material and have single-crystal atoms arrangement, wherein the first region has a different atoms arrangement than the fourth region, and wherein the step of depositing the growth material is performed under the deposition temperature and the precursor flow rate; (b) selecting a target yield for the semiconductor structure design; and (c) determining a desired deposition temperature and a desired precursor flow rate under which the step of depositing the growth material would form a plurality of identical semiconductor structures according to the semiconductor structure design having the target yield, wherein the desired deposition temperature and the desired precursor flow rate are determined based on the relationship.

The present invention provides the advantage of fabricating semiconductor devices having a relatively higher yield than is disclosed in the prior art.

DETAILED DESCRIPTION OF THE INVENTION

The Structures

Figure 1A:
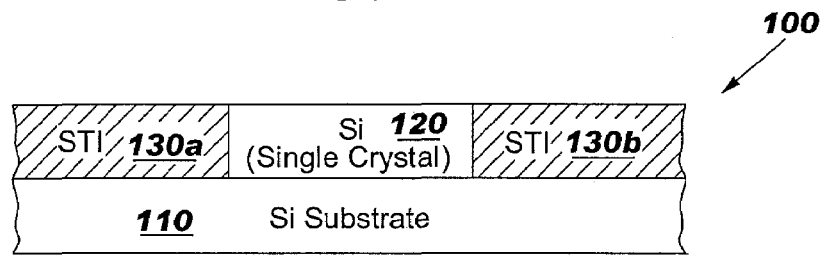
FIGS. 1A-1C illustrate cross-sectional views of a semiconductor structure after each of a series of fabrication steps is performed, in accordance with embodiments of the present invention.

FIG. 1A illustrates a cross-sectional view of a semiconductor structure 100 after a single-crystal Si (silicon) region 120 and two shallow trench isolation (STI) regions 130a and 130b are formed on a Si substrate 110, in accordance with embodiments of the present invention. More specifically, the fabrication process of the structure 100 starts out with the Si substrate 110. Then, a single-crystal Si layer 120, 130a, 130b is formed on top of the Si substrate 110. Illustratively, the single-crystal Si layer 120, 130a, 130b can be epitaxially grown on the Si substrate 110. Next, the STI regions 130a and 130b are formed in the single-crystal Si layer 120, 130a, 130b by first etching two shallow trenches 130a and 130b in the single-crystal Si layer 120, 130a, 130b and then filling the shallow trenches 130a and 130b with, illustratively, silicon dioxide ($SiO_2$). The single-crystal Si region 120 is sandwiched between and defined by the STI regions 130a and 130b.

Figure 1B:
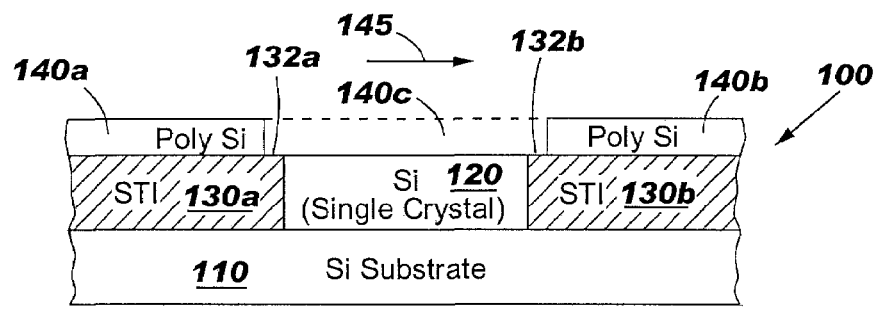

FIG. 1B illustrates a cross-sectional view of the semiconductor structure 100 after polysilicon seed layers 140a and 140b are formed on top of the STI regions 130a and 130b, respectively, in accordance with embodiments of the present invention. More specifically, a polysilicon seed layer 140a, 140c, 140b is first deposited on top of the entire structure 100 of FIG. 1A (i.e., on top of the single-crystal Si region 120 and the STI regions 130a and 130b) using, illustratively, a physical vapor deposition step. Next, a portion 140c of the polysilicon seed layer 140a, 140c, 140b above the single-crystal Si region 120 is etched away using, illustratively, photolithography masking and chemical etching. In one embodiment, the etched portion 140c is wider than the single-crystal Si region 120 in a direction 145. As a result, after the portion 140c is etched away, surfaces 132a and 132b of the STI regions 130a and 130b, respectively, are exposed to the atmosphere. What remain of the polysilicon seed layer 140a, 140c, 140b after the chemical etching step are the polysilicon seed layers 140a and 140b on top of the STI regions 130a and 130b, respectively.

Figure 1C:
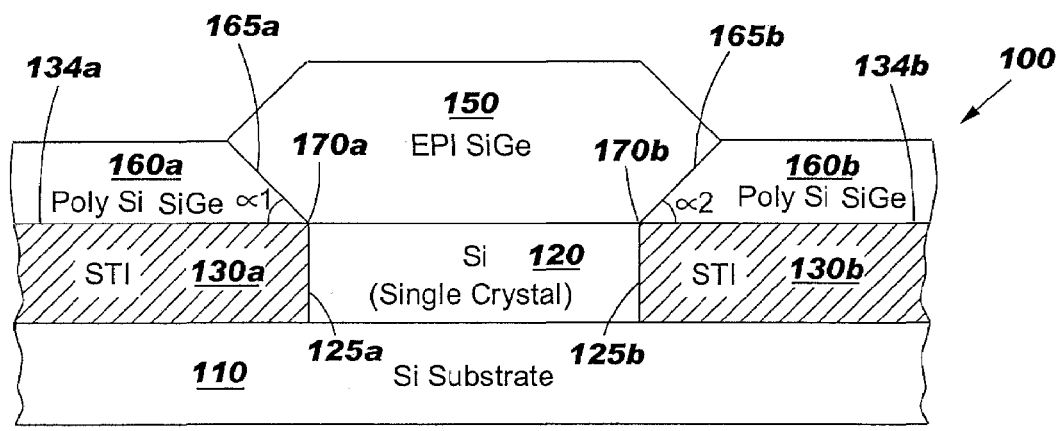

FIG. 1C illustrates a cross-sectional view of the semiconductor structure 100 after a SiGe layer 160a, 150, 160b is grown on the single-crystal Si region 120 and the STI regions 130a and 130b, in accordance with embodiments of the present invention. More specifically, in one embodiment, the SiGe layer 160a, 150, 160b is formed by simultaneously depositing silicon-germanium (SiGe) mixture on top of the single-crystal Si region 120 and the STI regions 130a and 130b. In fact, the SiGe layer 160a, 150, 160b resulting from the SiGe deposition comprises three separate regions having different atoms arrangements: a single-crystal EPI (epitaxial) SiGe region 150, and two polysilicon SiGe regions 160a and 160b. More specifically, during the SiGe deposition, the EPI SiGe region 150 is epitaxially grown from and on top of the single-crystal Si region 120. At the same time, polysilicon SiGe regions 160a and 160b are grown from and on top of the polysilicon seed layers 140a and 140b and some exposed surfaces 132a and 132b of the STI regions 130a and 130b, respectively (FIG. 1B). As a result, the polysilicon seed layers 140a and 140b (FIG. 1B) merge into the polysilicon SiGe regions 160a and 160b (FIG. 1C), respectively.

Deposition Conditions, EPI SiGe/Poly Growth Ratio, and Yields

The EPI SiGe region 150 and the polysilicon SiGe region 160a are in direct physical contact with each other via a common interface surface 165a. The common interface surface 165a makes with a top surface 134a of the STI regions 130a an interface growth angle α1. When the EPI SiGe region 150 and the polysilicon SiGe region 160a grow, the common interface surface 165a grows from the top edge 170a of a common interface surface 125a between the single-crystal Si region 120 and the STI region 130a. The top edge 170a is also called the STI corner 170a.

Similarly, the EPI SiGe region 150 and the polysilicon SiGe region 160b are in direct physical contact with each other via a common interface surface 165b. The common interface surface 165b makes with a top surface 134b of the STI regions 130b an interface growth angle α2. When the EPI SiGe region 150 and the polysilicon SiGe region 160b grow, the common interface surface 165b grows from the top edge 170b of a common interface surface 125b between the single-crystal Si region 120 and the STI region 130b. The top edge 170b is also called the STI corner 170b.

On one hand, it has been observed by the inventors of the present invention that material stress at the STI corner 170a is greatest when α1 approaches 90° and decreases when α1 decreases. Similarly, material stress at the STI corner 170b is greatest when α2 approaches 90° and decreases when α2 decreases. On the other hand, α1 and α2 depend on the EPI SiGe/Poly growth ratio (i.e., ratio of the growth rate of the EPI SiGe region 150 to the growth rate of the polysilicon SiGe regions 160a and 160b). More specifically, the higher the EPI SiGe/Poly growth ratio, the smaller α1 and α2. In addition, the yield of the structure 100 (FIG. 1C) depends on the material stress at the STI corners 170a and 170b. More specifically, the less the material stress at the STI corners 170a and 170b, the higher the yield of the structure 100. As a result, the yield of the structure 100 depends on the EPI SiGe/Poly growth ratio. More specifically, the higher the EPI SiGe/Poly growth ratio, the higher the yield of the structure 100.

Figure 2A:
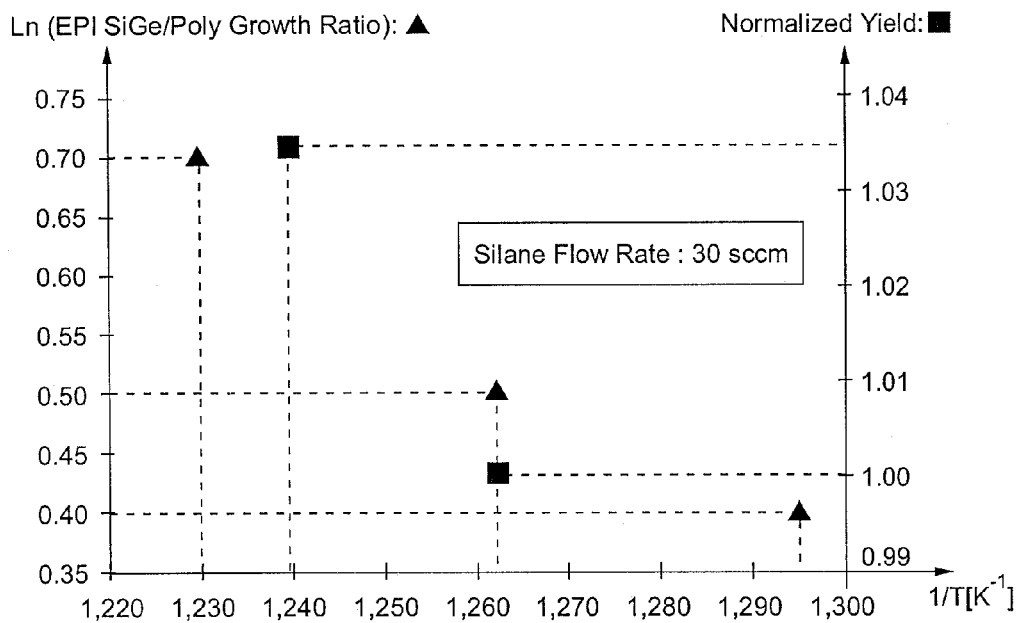
FIG. 2A illustrates the effects of SiGe deposition temperature on the structure and yield of the semiconductor structure of FIG. 1, in accordance with embodiments of the present invention.

It has also been observed by the inventors of the present invention that the EPI SiGe/Poly growth ratio depends on the temperature of the SiGe deposition (i.e., temperature of the top surface of the structure 100 and the deposited SiGe material). More specifically, the higher the temperature of the SiGe deposition, the higher the EPI SiGe/Poly growth ratio. The relationships between the yield of the structure 100, the EPI SiGe/Poly growth ratio, and the temperature of the SiGe deposition are illustrated in FIG. 2A which shows data collected from an experiment in which the tool platform (not shown) used has a tube chamber volume of approximately 3 cubic feet and the base pressure is $10^{-8}$-$10^{-9}$ Torr. The precursor used in the experiment is silane ($SiH_4$) with a flow rate of 30 sccm (standard centimeter cube per minute). According to FIG. 2A, when temperature of the SiGe deposition increases (i.e., moving to the left along the 1/T axis), both the EPI SiGe/Poly growth ratio and the yield of the structure 100 also increase.

Figure 2B:
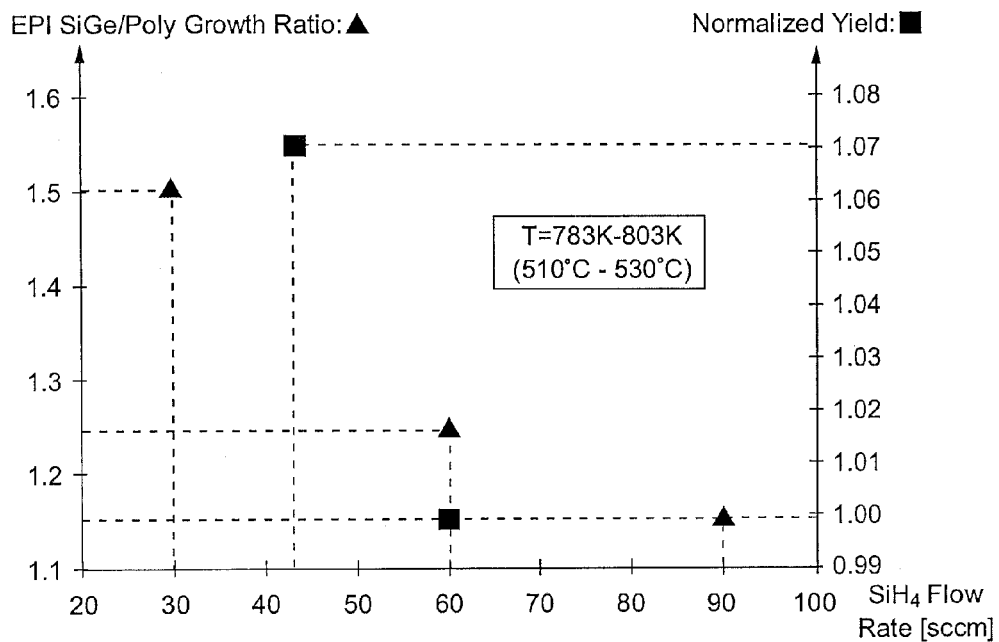
FIG. 2B illustrates the effects of silane flow rate on the structure and yield of the semiconductor structure of FIG. 1, in accordance with embodiments of the present invention.

Similarly, it has also been observed by the inventors of the present invention that the EPI SiGe/Poly growth ratio depends on the precursor flow rate of the SiGe deposition. More specifically, the lower the precursor flow rate of the SiGe deposition, the higher the EPI SiGe/Poly growth ratio. The relationships between the yield of the structure 100, the EPI SiGe/Poly growth ratio, and the precursor flow rate of the SiGe deposition are illustrated in FIG. 2B which shows data collected from an experiment in which the same platform used with respect to FIG. 2A is used. The precursor is also silane. However, here, the temperature of the SiGe deposition is fixed at a value in the range of 510-530° C., and silane flow rate is adjusted. According to FIG. 2B, when silane flow rate decreases (i.e., moving to the left along the horizontal axis), both the EPI SiGe/Poly growth ratio and the yield of the structure 100 increase.

In summary, with reference to FIGS. 1C, 2A, and 2B, by raising the temperature and/or lowering the precursor flow rate of the SiGe deposition of the SiGe layer 160a, 150, 160b, the EPI SiGe/Poly growth ratio is increased. This in turn reduces the material stress at the STI corners 170a and 170b by decreasing α1 and α2, respectively. As a result, the yield of the structure 100 increases. In other words, as a result of reducing the material stress at the STI corners 170a and 170b, it is less likely that cracks (if any) would expand from the STI corners 170a and 170b into the active regions 120 and 150. Therefore, the regions 120 and 150 become a better place for semiconductor devices. For example, an NPN device (not shown) may be fabricated in the regions 120 and 150. Illustratively, the collector of the NPN device can reside in the Si region 120. The base of the NPN device can reside in the region 150 and on top of the collector. The emitter of the NPN device can reside in the region 150 and on top of the base. With reduced material stress at the STI corners 170a and 170b, the likelihood of short circuits between the collector and emitter of the NPN device is reduced.

Design Methods

In one embodiment, a first plurality of identical semiconductor structures similar to the structure 100 of FIG. 1C is fabricated, wherein the condition of the deposition of silicon-germanium (SiGe) mixture on top of the single-crystal Si region 120 and the STI regions 130a and 130b (or in short, SiGe deposition condition) involves a fixed silane flow rate and a first deposition temperature. Then, a first yield of the first plurality of identical semiconductor structures is determined through testing each of the first plurality of identical semiconductor structures. Then, if the first yield is within a pre-specified range of a target yield (i.e., the first yield is greater than target yield, or within a pre-specified difference if the first yield is less than the target yield), the fixed silane flow rate and the first deposition temperature are considered satisfactory and can be used in mass production of the structure 100.

If the first yield is not within the pre-specified range of the target yield, a second plurality of identical semiconductor structures similar to the structure 100 of FIG. 1C is fabricated, wherein the SiGe deposition condition involves the fixed silane flow rate and a second deposition temperature which is higher than the first deposition temperature. In one embodiment, the selection of the second deposition temperature can take into consideration the effect(s) of a higher deposition temperature on the structures surrounding the structure 100 of FIG. 1C and on the structure 100 itself when the structure 100 goes through the ensuing fabrication steps. Then, a second yield of the second plurality of identical semiconductor structures is determined through testing each of the second plurality of identical semiconductor structures. Then, if the second yield is within the pre-specified range of the target yield, the fixed silane flow rate and the second deposition temperature are considered satisfactory and can be used in mass production. If the second yield is not within the pre-specified range of the target yield, a third plurality of identical semiconductor structures similar to the structure 100 of FIG. 1C is fabricated with an even higher third deposition temperature, and the process above is repeated until a satisfactory deposition condition is found which can be used for mass production of the structure 100.

In an alternative embodiment, SiGe deposition temperature is fixed at a fixed deposition temperature, and silane flow rate is adjusted down. In one embodiment, the selection of the next, lower silane flow rate can take into consideration the effect(s) of a lower silane flow rate on the speed of the SiGe deposition. Through similar procedures described above, a satisfactory deposition condition comprising the fixed deposition temperature and a last silane flow rate corresponding to a last plurality of identical semiconductor structures can be determined for mass production of the structure 100.

In a yet another alternative embodiment, after the first yield for the first plurality of identical semiconductor structures is determined, it is recorded along with the associated SiGe deposition condition (SiGe deposition temperature and precursor flow rate) instead of being compared with the target yield. Then, the second yield for the second plurality of identical semiconductor structures is determined and recorded along with the associated SiGe deposition condition. Then, a third yield for a third plurality of identical semiconductor structures is determined and recorded along with the associated SiGe deposition condition, and so on until an Nth yield for an Nth plurality of identical semiconductor structures is determined (N is an integer) and recorded along with the associated SiGe deposition condition. As a result, the yield of the structure 100 of FIG. 1C can be provided as a function of the associated SiGe deposition condition. For example, in one embodiment, the yield for the structure 100 and its associated deposition temperature and precursor flow rate can be plotted on a 3-axis system Oxyz (not shown) with axis Oz representing function yield and Ox and Oy representing variables deposition temperature and precursor flow rate. As a result, the yield has the shape of a surface (hereafter, referred to as the yield surface) in the Oxyz space.

Then, a target yield for the structure 100 can be selected, and from the just determined function, the precursor flow rate and deposition temperature associated with the target yield can be determined which can be used for mass production. In one embodiment, the target yield can be selected to be the maximum yield of the N yields. FIG. 2A illustrates only two yield values (1.00 and 1.032) corresponding to two different SiGe deposition conditions. Similarly, FIG. 2B illustrates only two normalized yield values (1.00 and 1.07) corresponding to two different SiGe deposition conditions.

In the example of the yield surface supra, a plane z=the selected target yield (not shown) cuts the yield surface to define a yield curve along which any pair of associated deposition temperature and precursor flow rate corresponding to the selected target yield may be chosen. In one embodiment, a target deposition temperature can be selected and can be represented by a plane x=target deposition temperature which intercepts the yield curve at a first point. The precursor flow rate associated with this first point and the target deposition temperature provide the deposition condition to determine the target yield for the structure 100.

In an alternative embodiment, a target precursor flow rate can be selected and can be represented by a plane y=target precursor flow rate which intercepts the yield curve at a second point. The deposition temperature associated with this second point and the target precursor flow rate provide the deposition condition to determine the target yield for the structure 100.

In the embodiments described above, SiGe deposition is used for illustration only. The invention is applicable to any other deposition. The precursor used is not restricted to silane.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method for forming semiconductor structures, the method comprising the steps of:
   (a) forming a first plurality of identical semiconductor structures, wherein each of the first plurality of identical semiconductor structures is formed by:
      (i) forming a first region and a second region, wherein the first region and the second region are in direct physical contact with each other via a first common interface surface, and
      (ii) depositing a growth material simultaneously on top of the first and second regions so as to grow a third region and a fourth region from the first and second regions, respectively, such that a second common interface surface between the third and fourth region grows from the first common interface surface,
      wherein the first and third regions comprise a same material and have single-crystal atoms arrangement,
      wherein the first region has a different atoms arrangement than the fourth region, and
      wherein the step of depositing the growth material is performed under a first deposition condition; then
   (b) determining a first yield of the first plurality of identical semiconductor structures, wherein a yield of a group of semiconductor structures is defined as a function of a percentage of satisfactory structures of the group of semiconductor structures in all the structures of the group of semiconductor structures; and then
   (c) if the first yield of the first plurality of identical semiconductor structures is not within a pre-specified range of a target yield, forming a second plurality of identical semiconductor structures, wherein each of the second plurality of identical semiconductor structures is formed by using steps similar to steps (a)(i) and (a)(ii), except that the step of depositing the growth material is performed under a second deposition condition different from the first deposition condition.

2. The method of claim 1, further comprising the steps of:
   determining a second yield of the second plurality of identical semiconductor structures; and then
   if the second yield of the second plurality of identical semiconductor structures is not within the pre-specified range of the target yield, forming a third plurality of identical semiconductor structures, wherein each of the third plurality of identical semiconductor structures is formed by using steps similar to steps (a)(i) and (a)(ii), except that the step of depositing the growth material is performed under a third deposition condition different from the second deposition condition.

3. The method of claim 2, wherein the first, second, and third deposition conditions comprise first, second, and third temperatures, namely, T1, T2, and T3, respectively, and wherein T1<T2<T3.

4. The method of claim 2, wherein the first, second, and third deposition conditions comprise first, second, and third pressures, namely, P1, P2, and P3, respectively, and wherein P1>P2>P3.

5. The method of claim 1, wherein the first and second deposition conditions comprise first and second temperatures, namely, T1 and T2, respectively, and wherein T1<T2.

6. The method of claim 1, wherein the first and second deposition conditions comprise first and second pressures, namely, P1 and P2, respectively, and wherein P1>P2.

7. The method of claim 6, wherein the first and second deposition conditions comprise first and second precursor flow rates, namely, F1 and F2, respectively, and wherein F1>F2.

8. The method of claim 1, wherein the first and third regions comprise single-crystal silicon.

9. The method of claim 1, wherein the growth material comprises silicon and germanium.

10. The method of claim 1, wherein the second region comprises a dielectric material.

11. The method of claim 1, wherein the fourth region comprises a polysilicon material.

12. The method of claim 1, further comprising the step of forming a seed layer on top of the second region before the step of depositing the growth material, wherein the seed layer comprises a same material as a material of the fourth region.

13. The method of claim 12, wherein the step of forming the seed layer comprises the steps of:
   depositing the seed layer on top of both the first and second regions; and then
   removing a portion of the seed layer on top of the first region resulting in the first region being exposed to a surrounding ambient through a space of the removed portion of the seed layer.

14. A method for forming semiconductor structures, the method comprising the steps of:
   (a) forming a first plurality of identical semiconductor structures, wherein each of the first plurality of identical semiconductor structures is formed by:
      (i) forming a first single-crystal semiconductor region and first and second shallow trench isolation regions on a semiconductor substrate, wherein the first single-crystal semiconductor region is disposed between the first and second shallow trench isolation regions, and
      (ii) depositing a growth material simultaneously (A) on top of the first single-crystal semiconductor region to grow a second single-crystal semiconductor region from the first single-crystal semiconductor region and (B) on top of the first and second shallow trench isolation regions to grow first and second polysilicon regions from the first and second shallow trench isolation regions, respectively,
      wherein the second single-crystal semiconductor region and the first polysilicon region are in direct physical contact with each other,
      wherein the second single-crystal semiconductor region and the second polysilicon region are in direct physical contact with each other, and
      wherein the step of depositing the growth material is performed under a first deposition condition; then
   (b) determining a first yield of the first plurality of identical semiconductor structures, wherein a yield of a group of semiconductor structures is defined as a function of a percentage of satisfactory structures of the group of semiconductor structures in all the structures of the group of semiconductor structures
   (c) if the first yield of the first plurality of identical semiconductor structures is not within a pre-specified range of a target yield, forming a second plurality of identical semiconductor structures, wherein each of the second plurality of identical semiconductor structures is formed by using steps similar to steps (a)(i) and (a)(ii), except that the step of depositing the growth material is performed under a second deposition condition different from the first deposition condition.

15. The method of claim 14, further comprising the steps of:
   determining a second yield of the second plurality of identical semiconductor structures; and then
   if the second yield of the second plurality of identical semiconductor structures is not within the pre-specified range of the target yield, forming a third plurality of identical semiconductor structures, wherein each of the third plurality of identical semiconductor structures is formed by using steps similar to steps (a)(i) and (a)(ii), except that the step of depositing the growth material is performed under a third deposition condition different from the second deposition condition.

16. The method of claim 15, wherein the first, second, and third deposition conditions comprise first, second, and third temperatures, namely, T1, T2, and T3, respectively, and wherein T1<T2<T3.

17. The method of claim 15, wherein the first, second, and third deposition conditions comprise first, second, and third pressures, namely, P1, P2, and P3, respectively, and wherein P1>P2>P3.

18. The method of claim 14, wherein the first and second deposition conditions comprise first and second temperatures, namely, T1 and T2, respectively, and wherein T1<T2.

19. The method of claim 14, wherein the first and second deposition conditions comprise first and second pressures, namely, P1 and P2, respectively, and wherein P1>P2.

20. The method of claim 19, wherein the first and second deposition conditions comprise first and second precursor flow rates, namely, F1 and F2, respectively, and wherein F1>F2.

21. A method for forming semiconductor structures, the method comprising the steps of:
   (a) forming a first plurality of identical semiconductor structures, wherein each of the first plurality of identical semiconductor structures is formed by:
      (i) providing a semiconductor substrate,
      (ii) forming a single-crystal silicon layer on the semiconductor substrate,
      (iii) forming first and second shallow trench isolation regions in the single-crystal silicon layer, the first and second shallow trench isolation regions defining a first single-crystal silicon region of the single-crystal silicon layer disposed between the first and second shallow trench isolation regions,
      (iv) growing a seed layer of polysilicon on top of the first and second shallow trench isolation regions, and
      (v) depositing silicon and germanium simultaneously (A) on top of the first single-crystal silicon region resulting in a second single-crystal silicon region and (B) on top of the seed layer resulting in first and second polysilicon regions on top of the first and second shallow trench isolation regions, respectively,
      wherein the second single-crystal silicon region and the first polysilicon region are in direct physical contact with each other,
      wherein the second single-crystal silicon region and the second ploy-silicon region are in direct physical contact with each other, and
      wherein the step of depositing silicon and germanium is performed under a first deposition condition; and
   (b) determining a first yield of the first plurality of identical semiconductor structures, wherein a yield of a group of semiconductor structures is defined as a function of a percentage of satisfactory structures of the group of semiconductor structures in all the structures of the group of semiconductor structures; and then
   (c) if the first yield of the first plurality of identical semiconductor structures is not within a pre-specified range of a target yield, forming a second plurality of identical semiconductor structures, wherein each of the second plurality of identical semiconductor structures is formed by using steps similar to steps (a)(i) through (a)(v) except that the step of depositing silicon and germanium is performed under a second deposition condition different from the first deposition condition.

22. The method of claim 21, further comprising the steps of:
   determining a second yield of the second plurality of identical semiconductor structures; and then
   if the second yield of the second plurality of identical semiconductor structures is not within the pre-specified range of the target yield, forming a third plurality of identical semiconductor structures, wherein each of the third plurality of identical semiconductor structures is formed by using steps similar to steps (a)(i) through (a)(v), except that the step of depositing silicon and germanium is performed under a third deposition condition different from the second deposition condition.

23. The method of claim 22, wherein the first, second, and third deposition conditions comprise first, second, and third temperatures, namely, T1, T2, and T3, respectively, and wherein T1<T2<T3.

24. The method of claim 22, wherein the first, second, and third deposition conditions comprise first, second, and third pressures, namely, P1, P2, and P3, respectively, and wherein P1>P2>P3.

25. The method of claim 21, wherein the first and second deposition conditions comprise first and second temperatures, namely, T1 and T2, respectively, and wherein T1<T2.

26. The method of claim 21, wherein the first and second deposition conditions comprise first and second pressures, namely, P1 and P2, respectively, and wherein P1>P2.

27. The method of claim 26, wherein the first and second deposition conditions comprise first and second precursor flow rates, namely, F1 and F2, respectively, and wherein F1>F2.

* * * * *